United States Patent [19]
Chesney et al.

[11] 3,940,666
[45] Feb. 24, 1976

[54] CIRCUIT MODULE WITH RECESS FOR RECEIVING A COUPLING COIL

[75] Inventors: John Chesney, Roselle Park, N.J.; Chester R. Kruczek, East Longmeadow, Mass.

[73] Assignee: General Instrument Corporation, Clifton, N.J.

[22] Filed: June 14, 1974

[21] Appl. No.: 479,191

[52] U.S. Cl. ........ 317/101 C; 317/101 CC; 330/65; 333/70 S; 333/76; 325/355
[51] Int. Cl.² ...................... H02B 1/04; H03H 7/10
[58] Field of Search.......... 174/68.5; 317/99, 101 R, 317/101 B, 101 C, 101 CB, 101 CE, 101 CC, 120; 333/70 R, 70 S, 76; 330/53, 56, 65–68, 154, 170, 171, 165, 178; 325/355–357

[56] References Cited
UNITED STATES PATENTS

| | | | |
|---|---|---|---|
| 2,169,708 | 8/1939 | O'Callaghan | 317/101 CC X |
| 2,648,031 | 8/1953 | Lang et al. | 317/101 R |
| 2,762,987 | 9/1956 | Mackey | 317/101 C X |
| 2,947,914 | 8/1960 | Simons | 317/101 R |
| 2,967,267 | 1/1961 | Steinman et al. | 317/101 CC UX |
| 3,409,850 | 11/1968 | Oshima | 333/76 X |
| 3,644,848 | 2/1972 | Kruczek | 333/70 S |
| 3,651,381 | 3/1972 | Nojiri | 317/101 CC |

*Primary Examiner*—James R. Scott

[57] ABSTRACT

A circuit module, such as is used in a modular L-C filter, includes a support having a base portion and side portions. One or more electric circuit elements, such as inductors and capacitors, are mounted on the support. One of the side portions of the support is provided with an externally exposed recess which is adapted to at least partially receive an interconnecting element such as a coupling coil. Thus, two of the modules can be located on a circuit board in adjacent relationship with the recesses therein aligned to form a cavity in which the coupling coil is received, the coil itself preferably being independently mounted on the circuit board. In this manner, the amount of space required by the filter is substantially reduced.

18 Claims, 4 Drawing Figures

CIRCUIT MODULE WITH RECESS FOR RECEIVING A COUPLING COIL

The present invention relates to circuit modules which may be interconnected to form an electrical component and in particular to a circuit module which is designed to at least partially receive an interconnecting element, such as a coupling coil, within the physical confines thereof.

The electronics industry has long been producing electrical components which are composed of a plurality of circuit modules. Each module is physically distinct from the other modules in the component and normally contains one or more electrical circuits designed to perform a specific function. By releasably mounting the individual circuit modules on a circuit board, which contains the necessary interconnections, a great deal of versatility is achieved. Not only is replacement of a particular circuit in the case of malfunction thereof facilitated, but also the operating characteristics of the component may be changed or the component made to perform different functions by merely substituting different circuit modules as required.

A prime example of such an electronic component is an L-C filter. Such a filter normally comprises a plurality of circuit modules each of which contains a capacitor and an inductor connected to form a resonant circuit. The capacitor and inductor are mounted on a support and then the circuit is adjusted such that the appropriate resonant frequency is obtained. A shielding can is then placed over the support to form the module. The number of modules utilized in a particular filter is dependent upon the intended use of the filter. The modules are placed in side-by-side relationship on a circuit board upon which are mounted the appropriate interconnections between the the modules. These interconnections often include electrical elements such as coupling coils which are physically attached to the circuit board and electrically connected to the modules.

The recent trend towards miniaturization of electronic components has initiated various techniques to reduce the amount of space required by modular filters. However, since the physical size of certain circuit elements, for instance inductor coils, dictates, at least in part, the electrical properties thereof, miniaturization of these elements cannot be achieved beyond a certain point if the desired electrical characteristics are to be obtained. Therefore, other means of reducing the amount of space required by the filter must be considered. Since the coupling coils are physically mounted on the circuit board upon which the modules are placed, these coupling coils require a certain amount of space, thus enlarging the size of the circuit board beyond the amount of area required for mounting of the modules.

It is, therefore, a prime object of the present invention to provide a circuit module having an externally exposed recess adapted to at least partially receive an interconnecting element therein.

It is a further object of the present invention to provide a circuit module having an externally exposed recess which, when mounted adjacent other similar modules forms a cavity within which an interconnecting element may be received, thereby reducing the amount of space required by the component.

It is another object of the present invention to provide a circuit module which can be placed in adjacent relationship with other similar circuit modules on a printed circuit board such that no additional space on the circuit board is required for interconnecting components.

Although the present invention is particularly well adapted for use in circuit modules which make up a modular L-C filter, and therefore is described and illustrated in this context, it should be understood that the present invention need not be limited to circuit modules of the particular type described herein. The specific embodiment disclosed herein is for purposes of illustration of the present invention and is not intended to limit the present invention for use with circuit modules designed for the particular purpose described.

In accordance with the present invention a circuit module is provided comprising a support having a base portion and side portions. One or more electrical circuit elements are provided for mounting on the support. One of the side portions of the support has an externally exposed recess adopted to at least partially receive an interconnecting element such as a coupling coil. A shielding can which substantially surrounds the support and the circuit elements is provided. The can has a side opening which registers with the support recess when the can is mounted on the support.

The circuit module is designed to be mounted on a circuit board in adjacent relationship with other similar circuit modules. The recesses on the respective circuit modules align to form a cavity within which an interconnecting element, such as a coupling coil, may be wholly situated. In this manner, the size of the circuit board is reduced to the amount of the area necessary for mounting the modules, thereby substantially reducing the overall space required by the component.

To the accomplishment of the above and to such other objects as may hereinafter appear, the present invention relates to a circuit module having an externally exposed recess adapted to at least partially receive an interconnecting element as defined in the appended claims and as described in the specification, taken together with the accompanying drawings wherein like numerals refer to like parts and in which:

Figure 4:
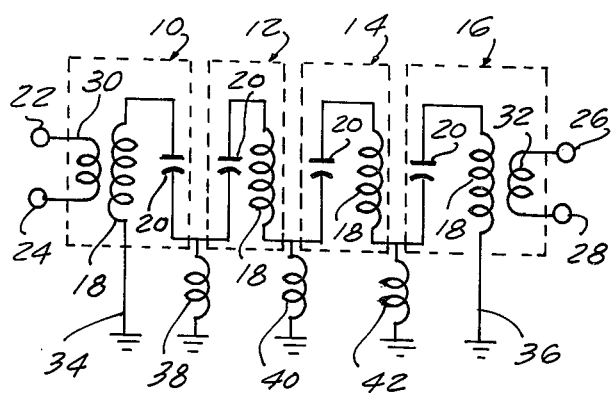
FIG. 4 is a schematic diagram of a modular L-C filter of the present invention.

FIG. 4 shows a schematic diagram of a four module L-C circuit. Each module is schematically represented by a dashed box which is generally designated as 10, 12, 14, and 16 respectively. Each of the modules 10, 12, 14, and 16 is comprised of an inductor coil 18 and a capacitor 20. Modules 10 and 16, the "input" and "output" modules, respectively, are provided with an additional winding 30, 32 respectively for coupling to external circuits. The circuit has a pair of input leads 22, 24 and a pair of output leads 26, 28. Input leads 22, 24 are operatively coupled to inductor 18 of module 10 by means of input winding 30. In a similar manner output leads 26 and 28 are operatively coupled to inductor 18 of module 16 by means of output winding 32. One side of inductor 18 of module 10 is connected to ground by means of a lead 34. In a similar manner, one side of inductor 18 of module 16 is connected to ground by means of a lead 36. Three coupling coils 38, 40, and 42 are provided to form a connection between ground and the respective nodes which interconnect adjacent modules. Specifically, coupling coil 38 connects the node between modules 10 and 12 to ground. Coupling coil 40 connects the node between modules 12 and 14 to ground and coupling coil 42 connects the node between modules 14 and 16 to ground.

Figure 1:
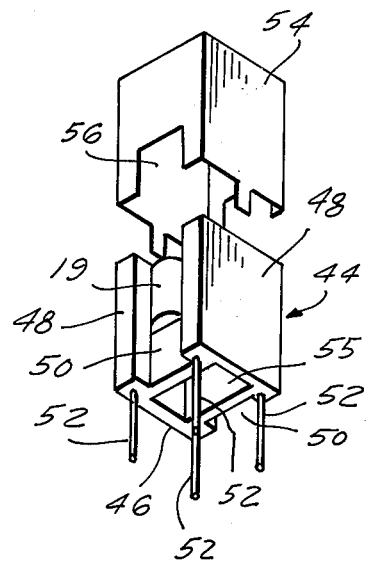
FIG. 1 is an exploded isometric view of a preferred embodiment of the module of the present invention.
Figure 3:
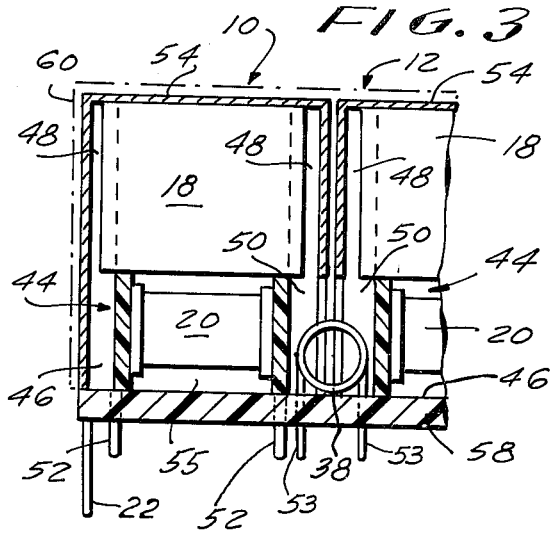
FIG. 3 is a front sectional view of a portion of an L-C filter composed of the modules of the present invention.

As can be seen in FIGS. 1 and 3, the circuit module comprises a support generally designated 44 which is formed of a base 46 and side walls 48, each of which is mounted perpendicular to base 46 at opposing edges thereof. Base 46 has a plurality of terminals 52 extending therefrom which are adapted to be received within apertures on the circuit board and to be connected to the printed circuit interconnections on the bottom of the board in any conventional manner, such as soldering.

Inductor coil 18 is situated within an enclosure 19 which in turn is mounted on top of base 46. A recess 55 is provided in the bottom of base 46 into which capacitor 20 is mounted. Coil 18 and capacitor 20 are mounted on base 46 so as to be within the peripheral confines of the support 44. One or more of the side walls 46 are provided with an externally exposed recess 50 which is adapted to at least partially receive a coupling coil therein. A shielding can 54 having a generally box-like structure with an open bottom is placed over support 44 in the conventional manner. Shielding can 54 is provided with a side opening 56 which, when shielding can 54 is in position, will register with recess 50.

Figure 2:
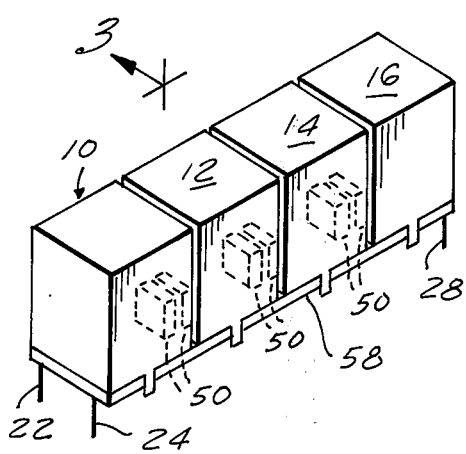
FIG. 2 is an isometric view of an L-C filter composed of a plurality of modules of the present invention.

Modules 10, 12, 14, and 16 are mounted on a circuit board 58 as shown in FIG. 2, and a cover member 60 is placed over the assembly of modules, as shown in FIG. 3. When the modules are located on circuit board 58 they are adjacent each other and the recesses 50 on adjacent modules align to form a cavity into which the coupling coil 38 may be wholly received. Since the coupling coil 38 is received within recesses 50 and extends out laterally therefrom, the depth of recesses 50 need only be approximately equal to one-half the diameter of the coupling coil. As can be seen from FIG. 2, circuit board 58 need be no larger than is necessary for the mounting of the modules. Thus, the modules of the present invention serve to substantially reduce the amount of space required by the filter by permitting the coupling coils to be situated within the physical confines of the modules.

Each of the coupling coils 38, 40, 42 is provided with a pair of terminals 53 which are received within apertures in circuit board 58 and connected to the printed circuit on the bottom of the board in any conventional manner such as soldering. The printed circuit on the bottom of board 58 is of conventional design and provides the appropriate interconnections between terminals 52 of the modules and terminals 53 of the coupling coils. Preferably, a common ground connection is provided to which one side of each coupling coil is connected. In addition, the shielding can 54 of each module is also connected to this common ground connection to assure that the cans 54 are properly grounded thus providing the necessary shielding.

As is conventional in the manufacture of printed circuit boards, board 58 is originally provided with a thin coating of copper on the bottom surface. The copper is then chemically etched, usually by means of photoetching in a manner well known in the art. This delineates the appropriate interconnections. The modules and coupling coils are then mounted on the board and soldered into place such that terminals 52 of the modules and terminals 53 of the coupling coils are connected to the printed circuit interconnections to form the filter.

It should be noted that the recesses 50 in base 46 is formed in support 44 adjacent capacitor 20 and beneath coil 18. Since capacitor 20 is somewhat smaller than coil 18, the space taken up by recesses 50 would be space which would be normally wasted within the module. Thus, the module itself need be no larger than the usual filter module in order to accommodate recesses 50. The module of the present invention is designed for more efficient utilization of space within the physical confines of the module. Thus, although the module may not be able to be made smaller because of the physical requirements of the electrical elements mounted therein, the more efficient use of the space within the module serves to substantially reduce the overall size of the filter.

While but a single preferred embodiment of the present invention has been specifically disclosed herein for purposes of illustration, it is apparent that many modifications and variations may be made therein. It is intended to cover all of these variations and modifications which fall within the scope of this invention as defined by the appended claims:

We claim:

1. In combination with a circuit board, a circuit module for use with an active interconnecting electrical component for electrically connecting said module with other circuits on said board, externally of said module, said component being mounted on said board adjacent and independently of said module, said module comprising a base portion, one or more electrical circuit elements mounted on said base portion to form the module circuit, means on said base portion for mounting said module on said board and a side portion having members thereon an externally exposed recess, said recess being large enough to at least partially receive said interconnecting component therein.

2. The module according to claim 1 further comprising a shield can received on an substantially surrounding said base and said circuit elements and having a side opening registering with said recess.

3. The module of claim 2 in which said circuit elements are mounted on said base so as to be within the peripheral confines of said side portion.

4. In combination with a circuit board, a circuit module and an active interconnecting electrical component mounted on said board adjacent and independently of said module for electrically connecting said module to a circuit on said board external to said module, said module comprising a base portion, one or more electrical circuit elements mounted on said base portion to form the module circuit, means on said base portion for mounting said module on said board and a side portion having members therein defining an externally exposed recess, said recess being large enough to at least partially receive said interconnecting component therein, said component being received in said recess and extending out laterally therefrom.

5. The module according to claim 4 further comprising a shield can received on and substantially surrounding said base and said circuit elements and having a side opening registering with said recess.

6. The module of claim 5 in which said circuit elements are mounted on said base so as to be within the peripheral confines of said side portions, the interconnecting component being larger than said recess so as to extend out laterally beyond said side portions through said side opening.

7. In combination with a circuit board, first and second circuit modules and an active interconnecting electrical component electrically connected to said modules, said modules each comprising a base portion, one or more electrical elements mounted on said base portion to form the circuit, means on said base portion for mounting said module on said board, and a side portion having members thereon defining an externally exposed recess, said recesses being aligned to form a cavity, said cavity being large enough to at least partially receive said interconnecting component therein.

8. The combination of claim 7 wherein said component is an inductance coil.

9. The module according to claim 7, further comprising a shield can received on and substantially surrounding said support and said circuit elements and having a side opening registering with said support recess.

10. The module of claim 9, in which said circuit elements are mounted on said support so as to be within the peripheral confines of said side portions of said support, the interconnecting component being larger than said recess so as to extend out laterally beyond said side portions through said side opening.

11. The module of claim 7, in which said circuit elements are mounted on said support so as to be within the peripheral confines of said side portions of said support, the interconnecting component being larger than said recess so as to extend out laterally beyond said side portions.

12. In combination, a printed circuit board, a pair of L-C modules mounted on said board adjacent one another, means on said board for electrically connecting said modules, each of said modules having a recess open at the side of said module facing the adjacent module, said recesses being aligned to form a cavity, and a coupling coil operatively connected to said module connecting means, separately mounted on said board and received in said cavity.

13. The combination of claim 12, in which said coupling coils is mounted on said circuit board.

14. The combination of claim 13, in which said recesses are also open at the bottom of the base portion of said support.

15. The combination of claim 12, in which said recesses are also open at the bottom of the base portion of said support.

16. The combination of claim 12, in which said modules comprise shielded cans substantially surrounding said modules and having side openings registering with said module recesses.

17. The combination of claim 16, in which said recesses are also open at the bottom of the base portion of said support.

18. The combination of claim 16, in which said recesses are also open at the bottom of the base portion of said support.

* * * * *